(12) United States Patent
Selvaraj et al.

(10) Patent No.: US 12,668,201 B2
(45) Date of Patent: Jun. 30, 2026

(54) VEHICULAR CONTROL SYSTEM WITH FAN AND SHROUD FOR ENHANCED COOLING AT ECU

(71) Applicant: Magna Electronics Inc., Auburn Hills, MI (US)

(72) Inventors: Deepak Selvaraj, Bangalore (IN); Rajith J N, Bangalore (IN); Varun S M, Bangalore (IN)

(73) Assignee: Magna Electronics Inc., Auburn Hills, MI (US)

( * ) Notice: Subject to any disclaimer, the term of this patent is extended or adjusted under 35 U.S.C. 154(b) by 320 days.

(21) Appl. No.: 18/490,007

(22) Filed: Oct. 19, 2023

(65) Prior Publication Data

US 2024/0132003 A1    Apr. 25, 2024
US 2024/0227704 A9    Jul. 11, 2024

Related U.S. Application Data

(60) Provisional application No. 63/380,242, filed on Oct. 20, 2022.

(51) Int. Cl.
H05K 7/20       (2006.01)
B60R 16/023     (2006.01)

(52) U.S. Cl.
CPC ..... B60R 16/0239 (2013.01); H05K 7/20145 (2013.01); H05K 7/20172 (2013.01); H05K 7/20409 (2013.01)

(58) Field of Classification Search
CPC ........... H05K 7/20409; H05K 7/20863; H05K 7/20145; H05K 7/20854; H05K 7/20172;
H05K 5/03; H05K 7/20418; B60R 16/0239; B60R 2300/802; B60R 2300/103; B60R 2001/1253; H01L 23/467; H01L 23/3672; G06F 1/20
USPC .......................................................... 361/688
See application file for complete search history.

(56) References Cited

U.S. PATENT DOCUMENTS

| | | | |
|---|---|---|---|
| 4,007,600 A * | 2/1977 | Simms ..................... | F25B 21/02 |
| | | | 62/3.6 |
| 5,550,677 A | 8/1996 | Schofield et al. | |
| 5,670,935 A | 9/1997 | Schofield et al. | |
| 5,949,331 A | 9/1999 | Schofield et al. | |
| 6,690,268 B2 | 2/2004 | Schofield et al. | |
| 6,824,281 B2 | 11/2004 | Schofield et al. | |
| 7,038,577 B2 | 5/2006 | Pawlicki et al. | |
| 7,480,149 B2 | 1/2009 | DeWard et al. | |

(Continued)

*Primary Examiner* — Mandeep S Buttar
(74) *Attorney, Agent, or Firm* — HONIGMAN LLP

(57) ABSTRACT

A vehicular electronic control unit (ECU) includes a printed circuit board (PCB) and a housing that accommodates the PCB. The PCB includes an electronic component that, when electrically operated, generates heat within the housing. Heat dissipating fins extend along an exterior side of the housing. Heat generated within the housing is dissipated via the heat dissipating fins. A shroud extends along the exterior side and covers the plurality of heat dissipating fins. A passageway extends through the shroud. An airflow source is electrically operated to draw air from within a cavity between the shroud and the exterior side of the housing and along and through the passageway and the drawn air flows between the exterior side and the shroud and along and between the heat dissipating fins to dissipate heat from the plurality of heat dissipating fins.

32 Claims, 4 Drawing Sheets

(56) References Cited

U.S. PATENT DOCUMENTS

| | | | |
|---|---|---|---|
| 7,720,580 B2 | 5/2010 | Higgins-Luthman | |
| 7,855,755 B2 | 12/2010 | Weller et al. | |
| 8,256,821 B2 | 9/2012 | Lawlor et al. | |
| 9,487,159 B2 | 11/2016 | Achenbach | |
| 9,596,387 B2 | 3/2017 | Achenbach et al. | |
| 9,871,971 B2 | 1/2018 | Wang et al. | |
| 9,896,039 B2 | 2/2018 | Achenbach et al. | |
| 10,104,808 B2 | 10/2018 | Scharinger et al. | |
| 11,019,324 B2 | 5/2021 | Ishii et al. | |
| 11,290,622 B2 | 3/2022 | Solar | |
| 11,997,371 B2 | 5/2024 | Kasarla | |
| 12,120,408 B2 | 10/2024 | Solar | |
| 2002/0080577 A1* | 6/2002 | Babcock | G06F 1/163 |
| | | | 361/679.46 |
| 2002/0126453 A1 | 9/2002 | Ubukata | |
| 2008/0016945 A1 | 1/2008 | Rothacher et al. | |
| 2009/0295181 A1 | 12/2009 | Lawlor et al. | |
| 2010/0089895 A1* | 4/2010 | Brown | H05B 3/30 |
| | | | 219/209 |
| 2012/0014064 A1 | 1/2012 | St. Rock et al. | |
| 2014/0055667 A1 | 2/2014 | Kawamura | |
| 2014/0160284 A1 | 6/2014 | Achenbach et al. | |
| 2014/0226012 A1 | 8/2014 | Achenbach | |
| 2015/0015713 A1 | 1/2015 | Wang et al. | |
| 2015/0327398 A1 | 11/2015 | Achenbach et al. | |
| 2016/0119509 A1 | 4/2016 | Wato | |
| 2016/0227079 A1 | 8/2016 | Oh | |
| 2016/0307953 A1 | 10/2016 | Kono et al. | |
| 2017/0064877 A1 | 3/2017 | Ratcliffe | |
| 2017/0070652 A1 | 3/2017 | Muller | |
| 2017/0129404 A1 | 5/2017 | Oda | |
| 2017/0131621 A1 | 5/2017 | Tang et al. | |
| 2017/0182944 A1 | 6/2017 | Achenbach et al. | |
| 2017/0184945 A1 | 6/2017 | Carlson | |
| 2019/0124238 A1 | 4/2019 | Byrne et al. | |
| 2019/0124243 A1 | 4/2019 | Mleczko et al. | |
| 2019/0128589 A1 | 5/2019 | Adams et al. | |
| 2019/0306966 A1 | 10/2019 | Byrne et al. | |
| 2019/0389385 A1* | 12/2019 | Diedrich | B60R 1/12 |
| 2020/0039447 A1 | 2/2020 | Winden | |
| 2020/0148137 A1 | 5/2020 | Cordeiro | |
| 2020/0154020 A1 | 5/2020 | Byrne et al. | |
| 2020/0263639 A1* | 8/2020 | Yang | F02M 26/06 |
| 2021/0094489 A1* | 4/2021 | Damaraju | B60R 16/0232 |
| 2021/0185862 A1* | 6/2021 | Nagao | B60H 1/00271 |
| 2021/0273371 A1* | 9/2021 | Sumida | H05K 5/0069 |
| 2021/0306538 A1 | 9/2021 | Solar | |
| 2021/0368082 A1 | 11/2021 | Solar | |
| 2021/0379958 A1* | 12/2021 | Hsiao | G06F 1/182 |

* cited by examiner

VEHICULAR CONTROL SYSTEM WITH FAN AND SHROUD FOR ENHANCED COOLING AT ECU

CROSS REFERENCE TO RELATED APPLICATION

The present application claims the filing benefits of U.S. provisional application Ser. No. 63/380,242, filed Oct. 20, 2022, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known.

Examples of such known systems are described in U.S. Pat. Nos. 5,949,331; 5,670,935 and/or 5,550,677, which are hereby incorporated herein by reference in their entireties. Heat is generated during operation of the cameras.

SUMMARY OF THE INVENTION

A vehicular electronic control unit or module (vehicular ECU) may include a printed circuit board (PCB) including electronic circuitry. The vehicular ECU includes a housing that accommodates or houses the PCB at an interior portion of the housing. The electronic circuitry includes at least one heat generating electronic component that, when electrically operated during operation of the vehicular ECU, generates heat at the interior portion of the housing. A plurality of heat dissipating fins are disposed at and extend along an exterior side of the housing, and the plurality of heat dissipating fins are in thermal conductive connection with the interior portion of the housing. When heat is generated at the interior portion of the housing during operation of the vehicular ECU, the heat is at least partially dissipated from the interior portion of the housing via the plurality of heat dissipating fins. A shroud includes a surface that extends at least partially over and along the exterior side of the housing, and an opening or passageway is formed through the surface of the shroud. The plurality of heat dissipating fins disposed at the exterior side of the housing are disposed between the surface of the shroud and the exterior side of the housing. An airflow source is electrically operable to direct airflow through the opening and along the passageway of the shroud. When the airflow source is electrically operated to direct airflow along the passageway of the shroud, the airflow source draws air between the exterior side of the housing and the surface of the shroud and along and between the plurality of heat dissipating fins at the exterior side of the housing and through the opening of the shroud to dissipate heat from the interior portion of the housing and the plurality of heat dissipating fins.

These and other objects, advantages, purposes and features of the present invention will become apparent upon review of the following specification in conjunction with the drawings.

DESCRIPTION OF THE PREFERRED EMBODIMENTS

A vehicle vision system and/or driver or driving assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
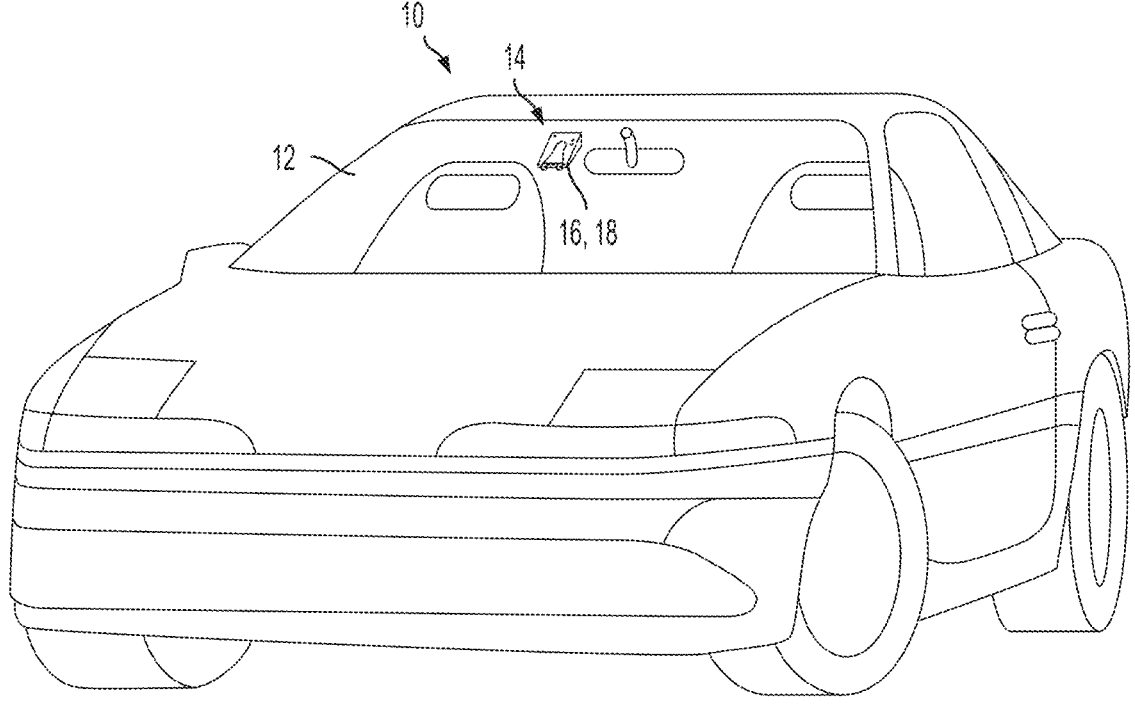
FIG. 1 is a perspective view of a vehicle with a vision system.

Referring now to the drawings and the illustrative embodiments depicted therein, a vision system 14 for a vehicle 10 includes at least one exterior viewing imaging sensor or camera, such as a forward viewing imaging sensor or camera, which may be disposed at and behind the windshield 12 of the vehicle 10 and viewing forward through the windshield 12 so as to capture image data representative of the scene occurring forward of the vehicle (FIG. 1). Optionally, the system 14 may include multiple exterior viewing imaging sensors or cameras, such as a forward viewing camera at the front of the vehicle, and a sideward/rearward viewing camera at respective sides of the vehicle, and a rearward viewing camera at the rear of the vehicle, which capture images exterior of the vehicle. The camera or cameras each include a lens for focusing images at or onto an imaging array or imaging plane or imager of the camera. The forward viewing camera may be part of a camera module or windshield mounted electronics module (WEM) 16 disposed at the windshield 12 of the vehicle 10 and views through the windshield 12 and forward of the vehicle 10, such as for a machine vision system (such as for traffic sign recognition, headlamp control, pedestrian detection, collision avoidance, lane marker detection and/or the like). The vision system 14 includes a control or electronic control unit (ECU) having electronic circuitry and associated software, with the electronic circuitry including a data processor or image processor that is operable to process image data captured by the camera or cameras, whereby the system, via processing of the captured sensor data at the ECU, may detect or determine presence of objects or the like and/or the system provide displayed images at a display device for viewing by the driver of the vehicle. The camera module 16 may accommodate the ECU or the ECU may be disposed at any suitable location at the vehicle. The data transfer or signal communication from the camera to the ECU may comprise any suitable data or communication link, such as a vehicle network bus or the like of the equipped vehicle.

Advanced driving assistance systems (ADAS) or vision systems include a significantly increasing number of features and perform an increasing number of functions to both provide additional functionality to consumers and also to meet industry standards and governmental regulations. Additionally, a common or singular or central ECU may process data from various sensors in the vehicle (e.g., exterior viewing camera module, radar sensors, driver/cabin monitoring camera, surround view system cameras, cameras for camera monitoring systems (CMS), and the like) to provide the additional functionality. For example, the ECU module may include one or more printed circuit boards (PCBs) accommodating one or more integrated chips or integrated circuits (ICs) to provide the increased processing. An increased number of features and functions results in a higher demand for processing speed and increased power consumption by ECUs and ADAS modules.

When the ECU provides the additional functionality and increased processing, this will result in greater heat generation at the ECU module. However, requirements for maximum operating ambient temperature of the ECU may require the ECU to operate below a threshold temperature, such as 85 degrees Celsius or less, because operating electronics devices at high temperatures, such as above the threshold temperature, is a challenge. That is, with the growing demand to integrate multiple PCBs and provide multifunctional electronics on one platform, this increases the thermal risks to the ICs and may cause failure.

As shown in FIGS. 2-5, the ECU module 18 includes a PCB 20 (and may optionally include a plurality of PCBs) that includes one or more ICs or other heat generating electronic components 22. The PCB 20 may include a first side or surface 20a and a second side or surface 20b separated from the first side 20a by a thickness of the PCB 20, with the heat generating electronic components 22 disposed at the first side 20a of the PCB 20. The PCB 20 is housed or disposed between a front or upper cover or housing 24 and a rear or lower cover or housing 26, where the rear cover 26 is attached to the PCB 20 (such as via screws or other suitable fasteners or adhesives) at the second side 20b and the front housing 24 is attached to the PCB 20 or the rear cover 26 and extends over and along the first side 20a of the PCB 20. Thus, the heat generating electronic components 22 at the PCB 20 face the front housing 24 and the second side 20b of the PCB 20 faces or is attached to the rear housing 26. The housing (and any associated heat dissipating fins) may be formed of metal or plastic material.

Figure 2:
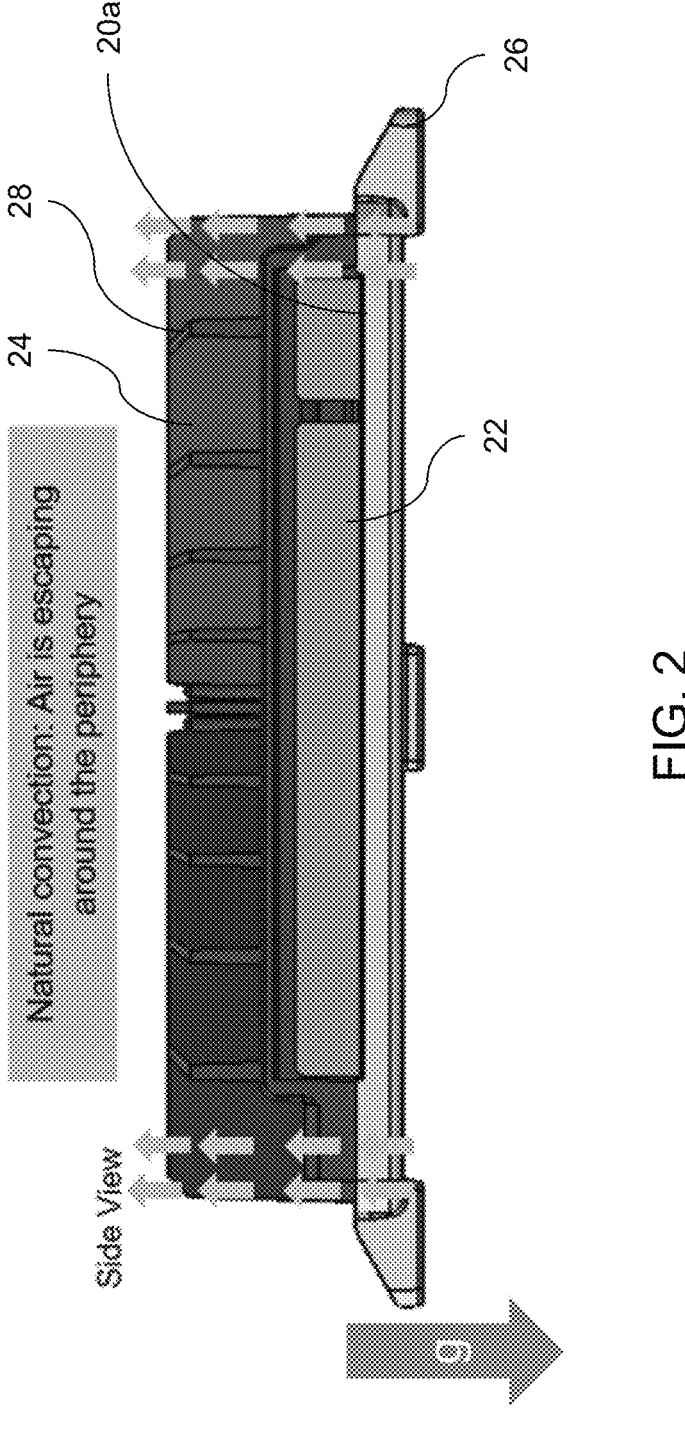
FIG. 2 is a side view of an electronic control unit (ECU) module having a front housing with heat dissipating fins for natural heat convection away from the ECU module.

As shown in FIG. 2, with the ECU module 18 mounted at the vehicle and when the ECU is electrically operated and the electronic components 22 generate heat, the heat generated by the electronic components 22 at the PCB 20 may naturally dissipate and escape around the periphery of the ECU module 18 and against the direction of gravity. In the illustrated example, the first side 20a of the PCB 20 faces upward and thus the heat escapes or dissipates from the PCB 20 toward the front housing 24 and along the perimeter of the front housing 24. That is, natural convection may draw hot air away from the ECU module 18 upward through and/or around the front housing 24 and along the perimeter region or periphery of the front housing 24. For example, the front housing 24 may include a plurality of heat dissipating fins 28 protruding in a first direction away from the first side 20a of the PCB 20 to draw or dissipate the heat away from the PCB 20.

However, relying on natural convection to draw heat away from the PCB 20 does not result in optimized heat dissipation from the PCB 20. For example, natural convection falls short in heat extraction through the fins 28 of the front housing 24 in an effective way. That is, natural convection does not efficiently utilize the heat dissipating qualities of the fins 28. Thus, and as discussed further below, the ECU module 18 provides optimized usage of fan induced forced convection to enhance heat transfer away from the ECU module 18.

Figures 3, 4:
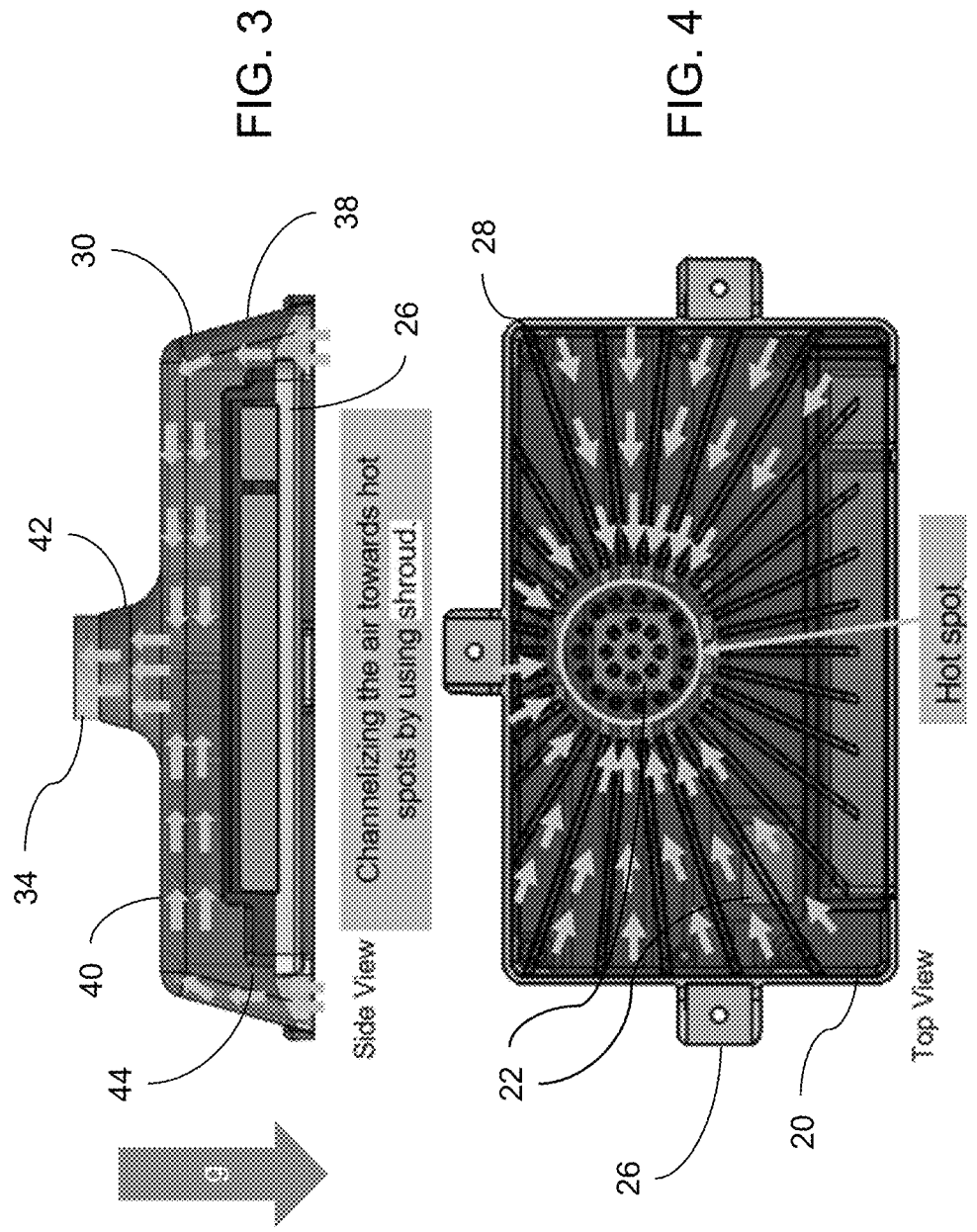
FIG. 3 is a side view of an ECU module having a shroud with integrated fan assembly mounted over the front housing for forced heat convection away from the ECU module.
FIG. 4 is a top view of the ECU module of FIG. 3, with the shroud removed to show direction of airflow along the fins of the front housing toward an opening of the shroud.
Figure 5:
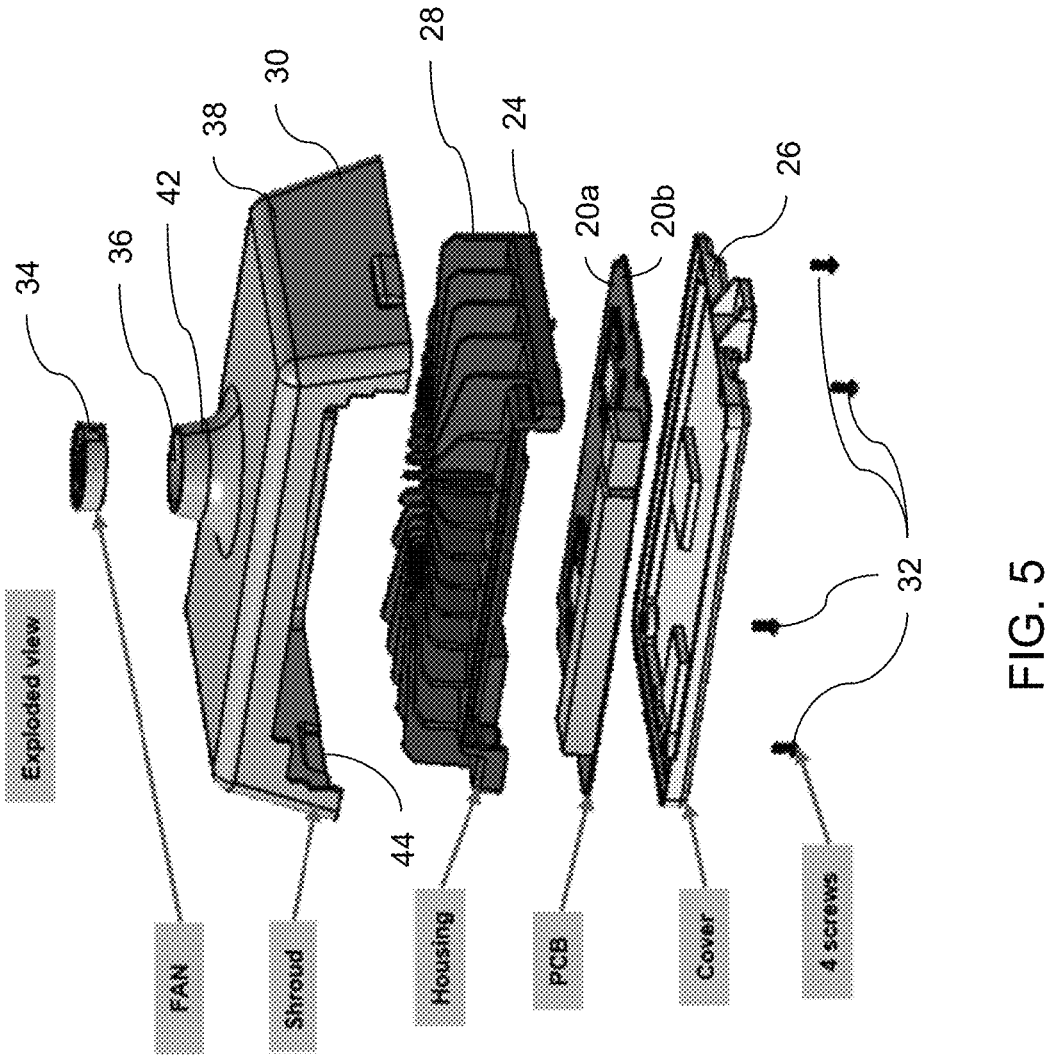
FIG. 5 is an exploded view of the ECU module of FIG. 3.

As shown in FIGS. 3-5, the ECU module 18 includes a shroud or outer cover 30 (such as a plastic or metal cover) disposed over the front housing 24 and attached to the PCB 20 or rear cover 26 or the front housing 24 (such as at a perimeter region of the front housing and/or rear housing). For example, fasteners or screws 32 may engage the rear cover 26, PCB 20, front housing 24 and/or the shroud 30 to assemble the ECU module 18 and sandwich the PCB 20 and front housing 24 between the shroud 30 and rear cover 26. A cavity or space or gap is between the shroud 30 and the outer surface of the front housing 24, with the heat dissipating fins 28 extending along the outer surface of the front housing 24 and within the cavity between the shroud 30 and the front housing 24. The shroud 30 includes a fan or suction source (e.g., a vacuum) 34 disposed at an opening 36 of a passageway extending through an upper surface of the shroud 30 to draw the heated air within the cavity upward along the passageway and through the opening 36 away from the front housing 24 and the PCB 20 and out of the cavity of the ECU module 18. For example, the opening 36 may be fluidly connected to a heating, ventilation, and air conditioning (HVAC) system of the vehicle to vent the heated air through an exhaust of the HVAC system.

The shroud 30, together with the fan 34 disposed at the opening 36, channels air flow from within the ECU module 18 along the fins 28 of the front housing 24 and out of the ECU module 18 to provide enhanced cooling to the heat generating electronic components 22 at the PCB 20. The shroud 30 substantially covers the first side 20a of the PCB 20 and front housing 24 to form a suction effect for airflow from within the ECU module 18 through the opening 36 via the fan 34. Furthermore, the opening 36 and fan 34 may be positioned according to a hotspot at the PCB 20 (FIG. 4), such as aligned with the position of an IC 22 at the first side 20a of the PCB 20 or at a central region of the PCB where heat may be most likely to collect.

In the illustrated example, the shroud 30 includes side walls 38 extending from an upper or planar surface 40 so that, when disposed over the front housing 24, the planar surface 40 is disposed over and along the fins 28 of the front housing 24 and the side walls 38 extend along the sides of the front housing 24 toward the rear cover 26. The side walls 38 may extend at an oblique angle relative to the upper surface 40 so that when the fan 34 is electrically operated to draw airflow out of the ECU module 18, the sidewalls may guide airflow from the heat generating components 22 at the PCB 20 upward toward the inner side of the upper surface 40 and the upper surface 40 may guide the airflow within the cavity and along the fins 28 and toward the opening 36. A spout or funnel or conical or frustoconical protrusion 42 extends from the upper surface 40 of the shroud 30 with the opening 36 extending through the spout 42 so that the spout 42 may guide air flow along the passageway toward the opening 36 via operation of the fan 34.

One or more air inlets or openings 44 may be disposed along one or more side walls 38 so that external air may enter the cavity between the shroud 30 and the front housing 24, flow along the fins 28 to dissipate heat and be drawn through the opening 36 to draw the heat away from the PCB 20. Similarly, external air may be drawn through spaces between the side walls 38 and the rear cover 26. That is, the one or more air inlets 44 may be disposed about the periphery of the junction between the shroud 30 and the rear cover 26 so that the air inlets 44 to the cavity are defined by spaces between the shroud 30 and the rear cover 26. Optionally, the fan 34 operates to direct or force airflow through the opening 36 and into the cavity between the shroud 30 and the upper surface 40 of the housing such that the airflow moves along and between the fins 28 and away from the ECU module through the one or more openings 44 about the perimeter of the ECU module to dissipate heat away from the ECU module.

The side walls 38 may include engagement features (such as fastener receiving holes) that allow the shroud 30 to be fastened to the rear cover 26 or the side walls may extend around or over the perimeter edges of the rear cover 26 to be fastened to structure other than the rear cover 26 (e.g., an inner surface of the camera module accommodating the ECU module 18). Moreover, the fins 28 of the front housing 24 may be configured to direct the airflow from the periphery region of the PCB 20 toward the hotspot of the PCB 20. In the illustrated example, the IC 22 is positioned at a central region of the PCB 20 and thus the fins 28 are arranged in a radially extending pattern originating from a central region of the front housing 24 aligned with the hotspot. Thus, the shroud 30 encases the PCB 20 and front housing 24 so that airflow generated by the fan 34 is directed along the fins 28 and out of the ECU module 18 through the opening 30 to dissipate heat generated by the components 22 at the PCB 20.

In other words, the peripheral air passing through the horizontally mounted ECU due to natural convection (e.g., FIG. 2) is captured using the shroud 30, which guides forced airflow through the aligned fin design, which in turn guides the external air toward the hot spot on the housing created by the maximum power consuming IC. The fan 34 induces forced convection by increasing the velocity of the air passing through the passage 36 of the shroud 30 and the fins 28 of the front housing 24.

The fan 34 may be integrated with the shroud 30 or mounted to the shroud 30 at or near or approximate to the opening 36, and the fan and shroud may be mounted on or over the front housing 24, such as with the help of mounting posts provided on the top surface of the front housing. A screw mount between the shroud 30 and the front housing 24 may provide better durability. The fan 34 may be powered from the PCB 20 through the vehicle wire harness. Moreover, the fan 34 is mounted to the shroud 30, instead of for example the front housing 24, to reduce vibrations on the housing, thus providing lower system impedance due to the suction action of the fan and providing better flow through the fins and concentrating the high velocity airflow toward the hot spot of the PCB.

Thus, the vision system provides a forced convection solution that may be suitably configured for various ECU and electronic device configurations, thus reducing the IC junction temperature by enhancing heat transfer through the fins at the ECU module housing. The system enhances heat transfer through the fins of the front housing, which results in lower temperature on the IC and a longer lifespan of the ECU module by ensuring safe operating temperatures within allowable junction temperatures. Further, the increased heat transfer may extend the IC to perform at higher power and ambient temperature conditions. Thus, better thermal efficiency may be achieved, greater workable ambient temperatures may be achieved, and the operating temperature of the IC may be improved via the shroud and active airflow at the ECU module. That is, the system may be operable in warmer ambient environments due to the improved thermal dissipation. Furthermore, the allowable operating temperature limits of ICs may be extended and higher efficiency ICs and system on a chip (SoC) may be used without changing the sizing of the PCB or mechanical components. Thermal fatigue failure induced due to high temperatures can be mitigated. Thus, the system may achieve larger power input with given ambient temperatures and thermal fatigue will be reduced.

Because the fan may be an energy efficient fan, lower operational costs may be achieved due to low power fan usage. Moreover, IC components may be clustered near the hotspot (because of the improved thermal dissipation from the hot spot), thus requiring fewer copper traces to connect the IC in the PCB and reducing the copper material usage, and in turn the PCB manufacturing costs. The life of the IC may be improved due to lower thermal expansion of different components and the PCB. Thus, the shroud and fan provides a low cost solution for the thermal constraints faced due to high temperatures at the IC.

Furthermore, a simpler fin design on the front housing may minimize the materials used and the costs related to the materials. The orientation of the ECU may be flexible due to fan usage by lesser dependency on natural convection. For example, natural convection is usually optimized when the fins are aligned parallel to gravity, but the shroud and fan may allow the fins to be aligned parallel to the direction of airflow (e.g., the airflow along the upper surface 40 of the shroud 30 toward the opening 36 caused by operation of the fan 34). In other words, when the ECU module is mounted at the vehicle, the ECU module may be oriented in any suitable manner because the active airflow source causes airflow between the exterior side of the front housing and the inner surface of the shroud and between the plurality of heat dissipating fins in any orientation of the ECU module. For example, when the ECU module is mounted at the vehicle, the plurality of heat dissipating fins may be disposed at a lower housing portion, with the shroud disposed over the lower housing portion and generally below the lower housing portion.

The design may be subjected to thermal simulations to extract the temperature data on the IC to make sure it is within allowable temperature limits of the IC and mechanical components. This thermal data may be used to carry out thermo-structural simulations to predict the thermal expansion and predict the life of the IC and PCB. Iterations may be carried out based on design of experiments method to attain optimized design. In other words, the upper housing 24, including the orientation of the plurality of fins 28, and the shroud 30, including the position of the opening 36, may be optimized based on airflow between the shroud 30 and upper housing and the position of heat generating components at the PCB 20.

The optimized design of the fan and integrated shroud may be further subjected to manufacturing to obtain a physical model for further testing and optimization. The shroud may comprise any suitable material, such as polycarbonate. Furthermore, an optimized fan will be used based on a simulation outcome. Validation will be carried out between simulations and experimentation, and impact analysis will be carried out for the design to quantify based on temperature measurements of the IC and the improved temperatures provided by the shroud and fan.

The ECU module may utilize characteristics of the camera modules described in U.S. Pat. No. 11,290,622 and/or U.S. Publication No. US-2021-0306538, and/or characteristics of the active airflow ECU modules described in U.S. Pat. Pub. US-2022-0239817, which is hereby incorporated herein by reference in its entirety.

The system may include an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. The imaging array may comprise a CMOS imaging array having at least 300,000 photosensor elements or pixels, preferably at least 500,000 photosensor elements or pixels and more preferably at least one million photosensor elements or pixels arranged in rows and columns. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352;

US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

Optionally, the camera may comprise a forward viewing camera, such as disposed at a windshield electronics module (WEM) or the like. The forward viewing camera may utilize aspects of the systems described in U.S. Pat. Nos. 11,290,622; 9,896,039; 9,871,971; 9,596,387; 9,487,159; 8,256,821; 7,480,149; 6,824,281 and/or 6,690,268, and/or U.S. Publication Nos. US-2021-0306538; US-2020-0039447; US-2015-0327398; US-2015-0015713; US-2014-0160284; US-2014-0226012 and/or US-2009-0295181, which are all hereby incorporated herein by reference in their entireties.

The ECU may be operable to process data for at least one driving assist system of the vehicle. For example, the ECU may be operable to process data (such as image data captured by a forward viewing camera of the vehicle that views forward of the vehicle through the windshield of the vehicle) for at least one selected from the group consisting of (i) a headlamp control system of the vehicle, (ii) a pedestrian detection system of the vehicle, (iii) a traffic sign recognition system of the vehicle, (iv) a collision avoidance system of the vehicle, (v) an emergency braking system of the vehicle, (vi) a lane departure warning system of the vehicle, (vii) a lane keep assist system of the vehicle, (viii) a blind spot monitoring system of the vehicle and (ix) an adaptive cruise control system of the vehicle. Optionally, the ECU may also or otherwise process radar data captured by a radar sensor of the vehicle or other data captured by other sensors of the vehicle (such as other cameras or radar sensors or such as one or more lidar sensors of the vehicle). Optionally, the ECU may process captured data for an autonomous control system of the vehicle that controls steering and/or braking and/or accelerating of the vehicle as the vehicle travels along the road.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular electronic control unit (ECU) module, the vehicular ECU module comprising:

a printed circuit board (PCB) comprising electronic circuitry;

a housing that accommodates the PCB;

wherein the vehicular ECU module is configured to be disposed at a vehicle equipped with the vehicular ECU module;

wherein the electronic circuitry includes a heat generating electronic component disposed on the PCB, and wherein the heat generating electronic component, when electrically operated, generates heat within the housing;

wherein a plurality of heat dissipating fins extend at least partially along an exterior side of the housing, and wherein, when heat is generated within the housing, the generated heat is at least partially dissipated via the plurality of heat dissipating fins;

a shroud comprising (i) an upper portion that extends at least partially along the exterior side of the housing and that at least partially covers the plurality of heat dissipating fins and (ii) a side wall that extends from the upper portion at least partially along a side portion of the housing, wherein a passageway extends through the upper portion of the shroud;

wherein an air inlet is disposed between the side wall of the shroud and the side portion of the housing to allow air to enter into a cavity between the shroud and the exterior side of the housing;

wherein the plurality of heat dissipating fins extend radially from a location at the exterior side of the housing that corresponds to a location of the passageway through the upper portion of the shroud;

an airflow source that is electrically operable to draw air along the passageway of the shroud;

wherein, with the vehicular ECU module disposed at the vehicle, and when the airflow source is electrically operated, the airflow source draws air (i) through the air inlet into the cavity between the shroud and the exterior side of the housing and (ii) from within the cavity along and through the passageway of the shroud; and wherein the drawn air flows (i) between the side portion of the housing and the side wall of the shroud, (ii) between the exterior side of the housing and the shroud and (iii) along and between the plurality of heat dissipating fins at the exterior side of the housing to dissipate heat from the plurality of heat dissipating fins.

2. The vehicular ECU module of claim 1, wherein the airflow source is disposed at or near the passageway of the shroud.

3. The vehicular ECU module of claim 1, wherein the airflow source comprises a fan disposed at or near the passageway of the shroud, and wherein the fan, when electrically operated, directs the drawn air away from the shroud.

4. The vehicular ECU module of claim 1, wherein the airflow source is spaced from the passageway of the shroud.

5. The vehicular ECU module of claim 4, wherein the airflow source comprises a heating, ventilation, and air conditioning (HVAC) system of the vehicle.

6. The vehicular ECU module of claim 1, wherein the airflow source comprises a vacuum source.

7. The vehicular ECU module of claim 1, wherein the shroud comprises a frustoconical protrusion, and wherein the passageway extends along and through the frustoconical protrusion.

8. The vehicular ECU module of claim 7, wherein the airflow source comprises a fan disposed at the shroud along the passageway at the frustoconical protrusion.

9. The vehicular ECU module of claim 1, wherein the side wall of the shroud extends at an oblique angle relative to the upper portion of the shroud.

10. The vehicular ECU module of claim 1, wherein the air inlet is provided at a perimeter edge region of the shroud.

11. The vehicular ECU module of claim 1, wherein the location of the passageway through the upper portion of the shroud corresponds to a location of the heat generating electronic component on the PCB.

12. The vehicular ECU module of claim 1, wherein the location from which the plurality of heat dissipating fins extend radially corresponds to a location of the heat generating electronic component of the PCB.

13. The vehicular ECU module of claim 1, wherein, with the vehicular ECU module disposed at the vehicle, the shroud extends above the exterior side of the housing.

14. The vehicular ECU module of claim 1, wherein, with the vehicular ECU module disposed at the vehicle, the shroud extends below the exterior side of the housing.

15. The vehicular ECU module of claim 1, wherein the vehicular ECU module is configured to be disposed at an in-cabin side of a windshield of the vehicle.

16. The vehicular ECU module of claim 15, wherein the vehicular ECU module comprises a vehicular forward-viewing camera module having a forward-viewing camera that, with the vehicular ECU module disposed at the in-cabin side of the windshield of the vehicle, views forward through the windshield of the vehicle.

17. The vehicular ECU module of claim 16, wherein the heat generating electronic component comprises an image processor operable to process image data captured by the forward-viewing camera.

18. The vehicular ECU module of claim 17, wherein, with the vehicular ECU module disposed at the in-cabin side of the windshield of the vehicle, the image processor is operable to process captured image data for at least one driving assist system of the vehicle.

19. The vehicular ECU module of claim 18, wherein the at least one driving assist system of the vehicle comprises at least one selected from the group consisting of (i) a headlamp control system of the vehicle, (ii) a pedestrian detection system of the vehicle, (iii) a traffic sign recognition system of the vehicle, (iv) a collision avoidance system of the vehicle, (v) an emergency braking system of the vehicle, (vi) a lane departure warning system of the vehicle, (vii) a lane keep assist system of the vehicle, (viii) a blind spot monitoring system of the vehicle and (ix) an adaptive cruise control system of the vehicle.

20. The vehicular ECU module of claim 1, wherein the plurality of heat dissipating fins are in thermal conductive connection with an interior portion of the housing.

21. A vehicular electronic control unit (ECU) module, the vehicular ECU module comprising:

a printed circuit board (PCB) comprising electronic circuitry;

a housing that accommodates the PCB;

wherein the vehicular ECU module is configured to be disposed at a vehicle equipped with the vehicular ECU module;

wherein the electronic circuitry includes a heat generating electronic component disposed on the PCB, and wherein the heat generating electronic component, when electrically operated, generates heat within the housing;

wherein a plurality of heat dissipating fins extend at least partially along an exterior side of the housing, and wherein, when heat is generated within the housing, the generated heat is at least partially dissipated via the plurality of heat dissipating fins;

a shroud comprising (i) an upper portion that extends at least partially along the exterior side of the housing and that at least partially covers the plurality of heat dissipating fins and (ii) a side wall that extends from the upper portion at least partially along a side portion of the housing;

wherein the upper portion of the shroud comprises a frustoconical protrusion, and wherein a passageway extends along and through the frustoconical protrusion of the upper portion of the shroud;

wherein the shroud comprises an air inlet disposed between the side wall of the shroud and the side portion of the housing to allow air to enter into a cavity between the shroud and the exterior side of the housing;

an airflow source that is disposed at the shroud along the passageway at the frustoconical protrusion, and wherein the airflow source is electrically operable to draw air along the passageway of the shroud;

wherein the plurality of heat dissipating fins extend radially from a location at the exterior side of the housing that corresponds to a location of the passageway through the frustoconical protrusion of the upper portion of the shroud;

wherein, with the vehicular ECU module disposed at the vehicle, and when the airflow source is electrically operated, the airflow source draws air (i) through the air inlet into the cavity between the shroud and the exterior side of the housing and (ii) from within the cavity along and through the passageway of the shroud; and wherein the drawn air flows (i) between the side portion of the housing and the side wall of the shroud, (ii) between the exterior side of the housing and the shroud and (iii) (ii) along and between the plurality of heat dissipating fins at the exterior side of the housing to dissipate heat from the plurality of heat dissipating fins.

22. The vehicular ECU module of claim 21, wherein the location of the passageway extends the frustoconical protrusion of the upper portion of the shroud corresponds to a location of the heat generating electronic component on the PCB.

23. The vehicular ECU module of claim 21, wherein the location from which the plurality of heat dissipating fins extend radially corresponds to a location of the heat generating electronic component of the PCB.

24. The vehicular ECU module of claim 21, wherein, with the vehicular ECU module disposed at the vehicle, the shroud extends above the exterior side of the housing.

25. The vehicular ECU module of claim 21, wherein, with the vehicular ECU module disposed at the vehicle, the shroud extends below the exterior side of the housing.

26. A vehicular electronic control unit (ECU) module, the vehicular ECU module comprising:

a printed circuit board (PCB) comprising electronic circuitry;

a housing that accommodates the PCB;

wherein the vehicular ECU module is configured to be disposed at an in-cabin side of a windshield of a vehicle equipped with the vehicular ECU module;

wherein the vehicular ECU module comprises a vehicular forward-viewing camera module having a forward-viewing camera that, with the vehicular ECU module disposed at the in-cabin side of the windshield of the vehicle, views forward through the windshield of the vehicle;

wherein the electronic circuitry includes a heat generating electronic component disposed on the PCB, and wherein the heat generating electronic component, when electrically operated, generates heat within the housing;

wherein a plurality of heat dissipating fins extend at least partially along an exterior side of the housing, and wherein, when heat is generated within the housing, the generated heat is at least partially dissipated via the plurality of heat dissipating fins;

a shroud comprising (i) an upper portion that extends at least partially along the exterior side of the housing and that at least partially covers the plurality of heat dissipating fins and (ii) a side wall that extends from the upper portion at least partially along a side portion of the housing, wherein a passageway extends through the upper portion of the shroud;

wherein an air inlet is provided at a perimeter edge region of the shroud and between the side wall of the shroud and the side portion of the housing to allow air to enter into a cavity between the shroud and the exterior side of the housing;

wherein the plurality of heat dissipating fins extend radially from a location at the exterior side of the housing that corresponds to a location of the passageway through the upper portion of the shroud;

an airflow source that is electrically operable to draw air along the passageway of the shroud;

wherein, with the vehicular ECU module disposed at the vehicle, and when the airflow source is electrically operated, the airflow source draws air (i) through the air inlet into the cavity between the shroud and the exterior side of the housing and (ii) from within the cavity along and through the passageway of the shroud; and wherein the drawn air flows (i) between the side portion of the housing and the side wall of the shroud, (ii) between the exterior side of the housing and the shroud and (iii) along and between the plurality of heat dissipating fins at the exterior side of the housing to dissipate heat from the plurality of heat dissipating fins.

27. The vehicular ECU module of claim 26, wherein the airflow source comprises a fan disposed at or near the passageway of the shroud, and wherein the fan, when electrically operated, directs the drawn air away from the shroud.

28. The vehicular ECU module of claim 26, wherein, with the vehicular ECU module disposed at the vehicle, the shroud extends above the exterior side of the housing.

29. The vehicular ECU module of claim 26, wherein, with the vehicular ECU module disposed at the vehicle, the shroud extends below the exterior side of the housing.

30. The vehicular ECU module of claim 26, wherein the heat generating electronic component comprises an image processor operable to process image data captured by the forward-viewing camera.

31. The vehicular ECU module of claim 30, wherein, with the vehicular ECU module disposed at the in-cabin side of the windshield of the vehicle, the image processor is operable to process captured image data for at least one driving assist system of the vehicle.

32. The vehicular ECU module of claim 31, wherein the at least one driving assist system of the vehicle comprises at least one selected from the group consisting of (i) a headlamp control system of the vehicle, (ii) a pedestrian detection system of the vehicle, (iii) a traffic sign recognition system of the vehicle, (iv) a collision avoidance system of the vehicle, (v) an emergency braking system of the vehicle, (vi) a lane departure warning system of the vehicle, (vii) a lane keep assist system of the vehicle, (viii) a blind spot monitoring system of the vehicle and (ix) an adaptive cruise control system of the vehicle.

* * * * *